United States Patent
Kang

(10) Patent No.: US 7,339,424 B2
(45) Date of Patent: Mar. 4, 2008

(54) APPARATUS AND METHOD FOR CONTROLLING TEMPERATURE OF ELECTRONIC APPARATUS

(75) Inventor: Kyoung Won Kang, Sungsam-si (KR)

(73) Assignee: LG Electronics Inc., Seoul (KR)

( * ) Notice: Subject to any disclaimer, the term of this patent is extended or adjusted under 35 U.S.C. 154(b) by 76 days.

(21) Appl. No.: 11/436,606

(22) Filed: May 19, 2006

(65) Prior Publication Data

US 2007/0268069 A1    Nov. 22, 2007

(30) Foreign Application Priority Data

May 19, 2005  (KR) .................... 10-2005-0041872

(51) Int. Cl.
    *H03F 3/38*  (2006.01)
(52) U.S. Cl. .................. 330/10; 330/289; 330/298; 330/207 P
(58) Field of Classification Search .......... 330/10, 330/289, 298, 207 P
    See application file for complete search history.

(56) References Cited

U.S. PATENT DOCUMENTS

| | | | | |
|---|---|---|---|---|
| 5,418,435 A | * | 5/1995 | Yamada | 315/308 |
| 5,515,258 A | * | 5/1996 | Viertler | 363/26 |
| 6,434,025 B2 | * | 8/2002 | Shirai et al. | 363/21.1 |
| 6,770,985 B2 | * | 8/2004 | Yabe et al. | 307/117 |
| 7,113,376 B2 | * | 9/2006 | Nomura et al. | 361/31 |
| 7,132,818 B2 | * | 11/2006 | Matsuura | 323/222 |
| 2006/0097765 A1 | * | 5/2006 | Asada | 327/172 |

* cited by examiner

*Primary Examiner*—Patricia Nguyen
(74) *Attorney, Agent, or Firm*—Birch, Stewart, Kolasch & Birch, LLP

(57) ABSTRACT

In an embodiment of this invention, if a state, in which duty ratio of a PWM signal is kept equal to or greater than a predetermined value, has been maintained for a first time period, the duty ratio of the PWM signal of a digital power amplifier is adjusted downward. Furthermore, the duty ratio of the PWM signal is maintained without change when the duty ratio of the PWM signal is adjusted downward for a second time period, and the duty ratio of the PWM signal is adjusted downward only when volume is set to a maximum value allowable in the power amplifier. Accordingly, the temperature of the power amplifier can be prevented from rapidly increasing, the internal temperature of an electronic apparatus can be efficiently prevented from increasing, and damage to the power amplifier resulting from increased temperature can be prevented.

7 Claims, 4 Drawing Sheets

$P_o$ : output power
$V_S$ : supply voltage
MI : PWM modulation index
$R_L$ : load resistance
$R_X$ : amplifier internal resistance

Full bridge (BTL) Amplifier

APPARATUS AND METHOD FOR CONTROLLING TEMPERATURE OF ELECTRONIC APPARATUS

BACKGROUND OF THE INVENTION

1. Field of the Invention

The present invention relates to an apparatus and method for controlling the temperature of an electronic apparatus and, more particularly, to an apparatus and method for controlling the temperature of a power amplifier that is included in an apparatus, such as a home theater system.

2. Description of the Related Art

An electronic apparatus, such as a home theater system, as shown in FIG. 1, may include a modulator 10, a digital power amplifier 20, a low-pass filter 30, and a speaker 40.

The modulator 10 converts input data into a Pulse Width Modulation (PWM) signal by imposing the input data on a reference signal, and then outputs the PWM signal. The digital power amplifier 20 variably amplifies the level of the PWM signal according to the value of a volume up/down key selected by a user and then outputs an amplified PWM signal. The low-pass filter 30 filters out the high-range components (square waves) of the amplified PWM signal, and outputs an analog output signal. The speaker 40 outputs audio corresponding to the filtered analog output signal. Accordingly, the user can listen to the audio at a desired volume by manipulating the volume up/down key.

When the user turns the volume up to a maximum level, the digital power amplifier 20 adjusts the amplification level of the PWM signal to maximize it. After a predetermined time has elapsed during which the amplification level in the digital power amplifier 20 is in a maximized state, problems occur in that the digital power amplifier 20 is damaged by the generation of high heat, and the performance of the electronic apparatus is worsened because the internal temperature of the electronic apparatus rapidly increases.

SUMMARY OF THE INVENTION

Accordingly, the present invention has been made keeping in mind the above problems occurring in the prior art, and an object of the present invention is to provide an apparatus and method for preventing the temperature of a power amplifier, which is included in an electronic apparatus, from rapidly increasing.

In order to accomplish the above object, the present invention provides a method of controlling the temperature of an electronic apparatus, the method including the steps of determining whether a state, in which the duty ratio of a Pulse Width Modulation (PWM) signal is kept equal to or greater than a predetermined value, has been maintained for a first time period; and adjusting the duty ratio of the PWM signal of a digital power amplifier downward if the state has been maintained for the predetermined time.

In addition, the present invention provides an apparatus for controlling temperature of an electronic apparatus, including a modulation unit for modulating input data to generate a PWM signal; an amplification unit for amplifying the PWM signal received from the modulation unit; a detection unit for detecting the duty ratio of the PWM signal; and a control unit for determining whether a state, in which the duty ratio of the PWM signal is kept equal to or greater than a predetermined value, has been maintained for a first time period, and controlling the amplification unit so that the duty ratio of the PWM signal to be output from the amplification unit is adjusted downward if the state has been maintained for the predetermined time period.

The duty ratio of the PWM signal is adjusted downward only when volume is set to a maximum value allowable in the digital power amplifier.

Furthermore, the duty ratio of the PWM signal is maintained without change when the duty ratio of the PWM signal is adjusted downward for a second time period.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF PREFERRED EMBODIMENTS

A preferred embodiment of an apparatus and method for controlling the temperature of an electronic apparatus according to the present invention are described in detail with reference to the accompanying drawings.

Figure 1:
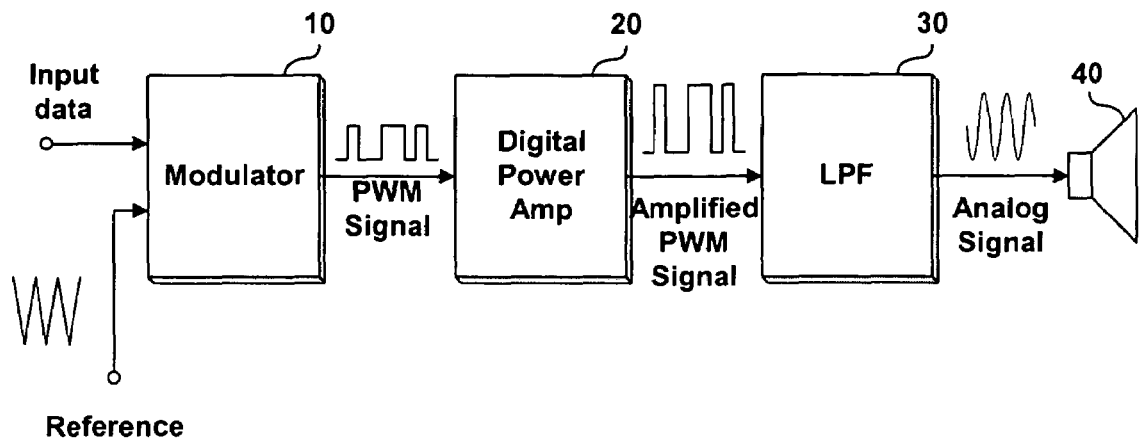
FIG. 1 is a block diagram showing part of the construction of a general audio electronic apparatus.
Figure 2:
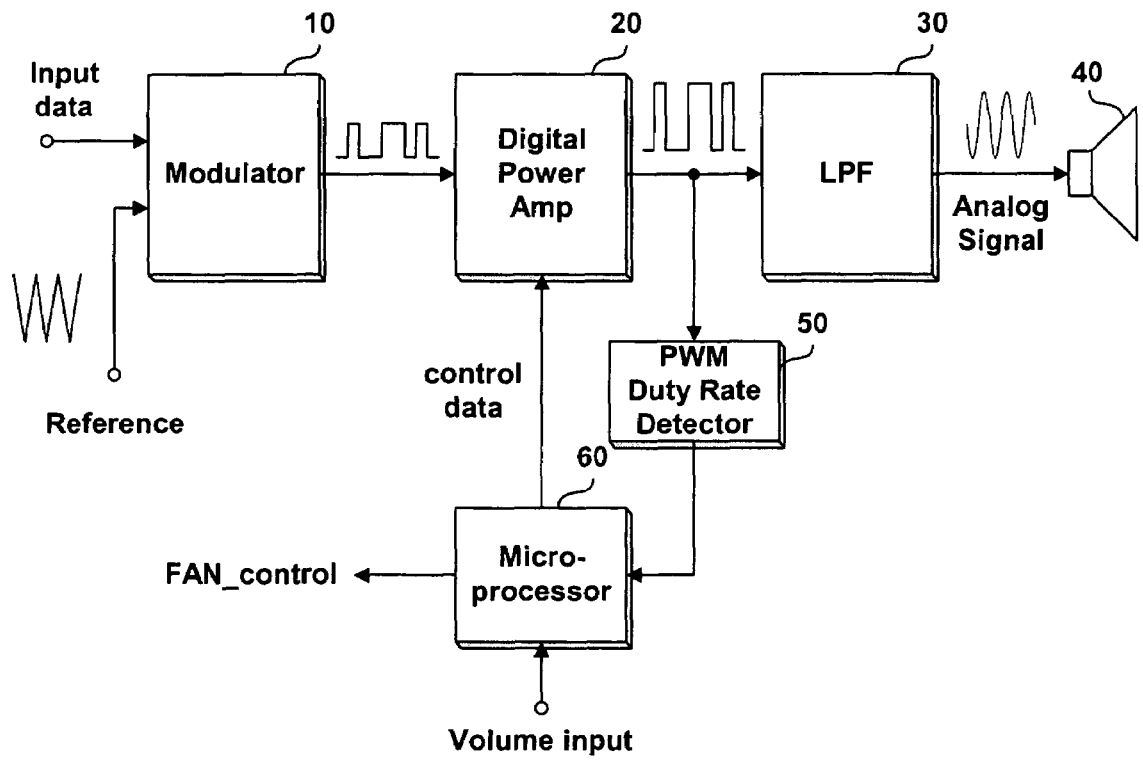
FIG. 2 is a block diagram showing part of the construction of an audio electronic apparatus to which the present invention is applied.

The apparatus and method for controlling the temperature of an electronic apparatus according to the present invention may be applied to various types of electronic apparatuses, such as home theater systems, that include digital power amplifiers. An electronic apparatus to which the present invention is applied, as shown in FIG. 2, includes a modulator 10, a digital power amplifier 20, a low-pass filter 30, a speaker 40, a duty ratio (or modulation index) detector 50, and a microprocessor 60.

The modulator 10 converts input data into a PWM signal by imposing the input data on a reference signal and then outputs the PWM signal. The digital power amplifier 20 variably amplifies the level of the PWM signal and then outputs an amplified PWM signal. The low-pass filter 30 filters out the high-range components of the amplified PWM signal and an analog signal is output through the speaker 40.

The duty ratio detector 50 detects the duty ratio of the PWM signal. The microprocessor 60 examines the volume set by a user and the duty ratio detected by the duty ratio detector 50, and controls the operation of the digital power amplifier 20 according to examination results so that the temperature of the electronic apparatus does not increase. The duty ratio detector 50, as shown in FIG. 2, may detect the duty ratio of the PWM signal amplified and output by the digital power amplifier 20, or may detect the duty ratio of the PWM signal input to the digital power amplifier 20.

When the volume adjusted by the user has reached the maximum value Vol_MAX allowable in the digital power amplifier 20 and the detected duty ratio is equal to or greater than a predetermined value, the microprocessor 60 determines that heat generated by the digital power amplifier 20 is very high, and adjusts the duty ratio of the PWM signal by controlling the digital power amplifier 20.

That is, when the state in which the volume reaches the maximum value and the duty ratio is equal to or greater than the predetermined value is maintained for a predetermined time, the microprocessor 60 repeats an operation of reducing the duty ratio of the PWM signal and then increasing it above the predetermined value again.

Furthermore, the microprocessor 60 may operate a cooling fan when the above-described state is maintained.

Figure 3:
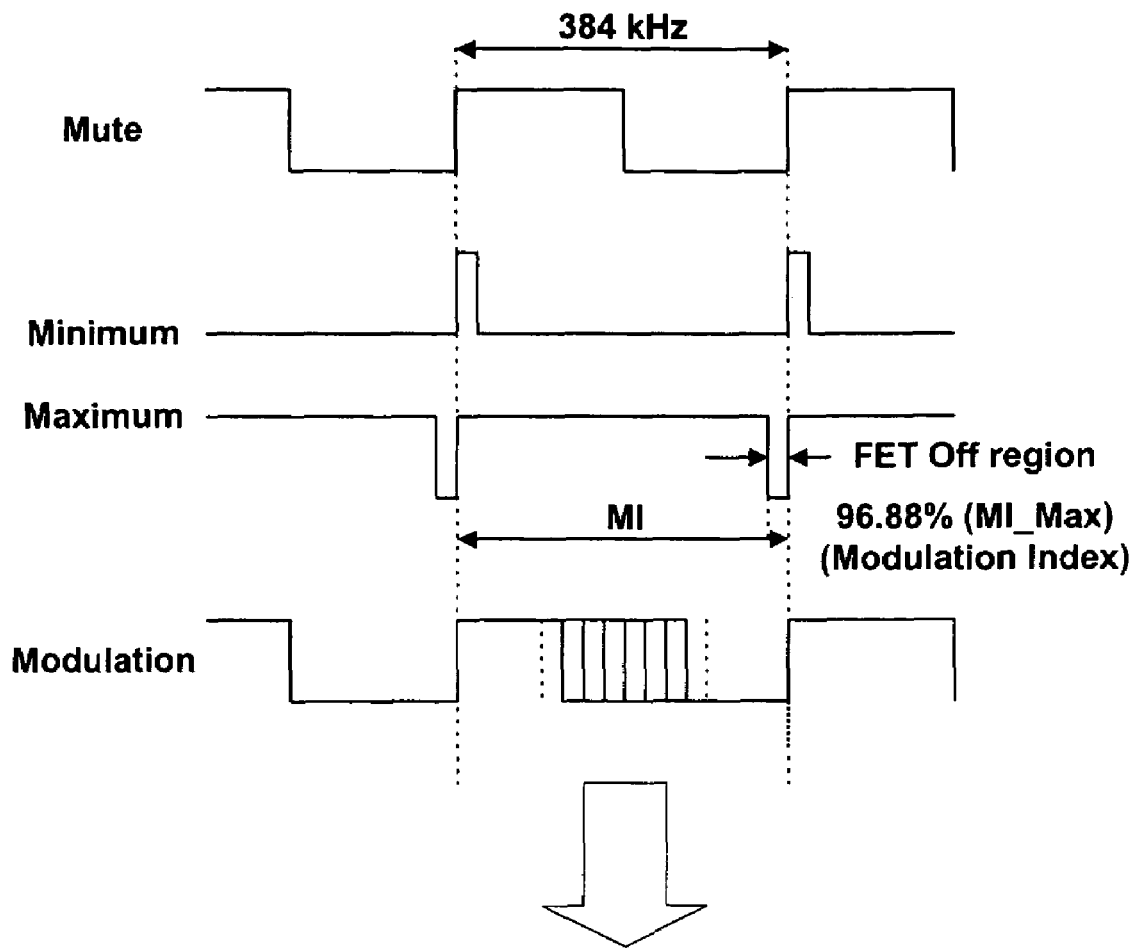
FIG. 3 is a diagram showing an example of calculation of the output electric power of a digital power amplifier to which the present invention is applied.

As shown in FIG. 3, the output power $P_O$ of the digital power amplifier 20 is calculated from supply voltage $V_S$, PWM duty ratio or PWM modulation index MI, load resistance $R_L$, and amplifier internal resistance $R_X$. When the PWM modulation index has reached the maximum value MI_MAX, the maximum output power is generated and, at the same time, maximum heat is generated by the digital power amplifier 20.

Generally, in the case where a user adjusts a sound effect, such as an equalizer or a surround sound effect, the duty ratio of the PWM signal may change. In this case, the duty ratio of the PWM signal can be adjusted separately from the volume related to the amount of sound.

The microprocessor 60 controls the time for which the PWM modulation index is maintained at a maximum in such a manner that the PWM modulation index is reduced after a predetermined time, for example, several seconds, has elapsed, and the PWM modulation index is maintained again at a maximum after the predetermined time has elapsed, so that the continuous generation of high heat can be prevented.

Figure 4:
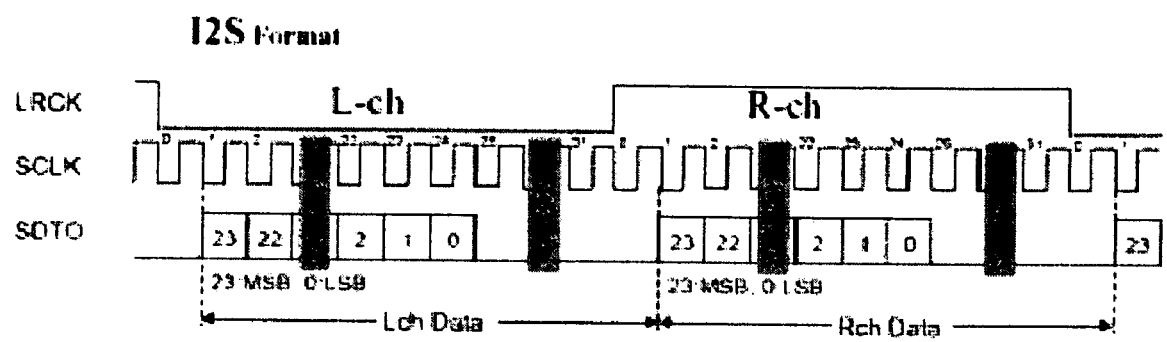
FIG. 4 is a diagram showing an embodiment of data transmitted and received between the digital power amplifier, to which the present invention is applied, and a microprocessor.
Figure 5:
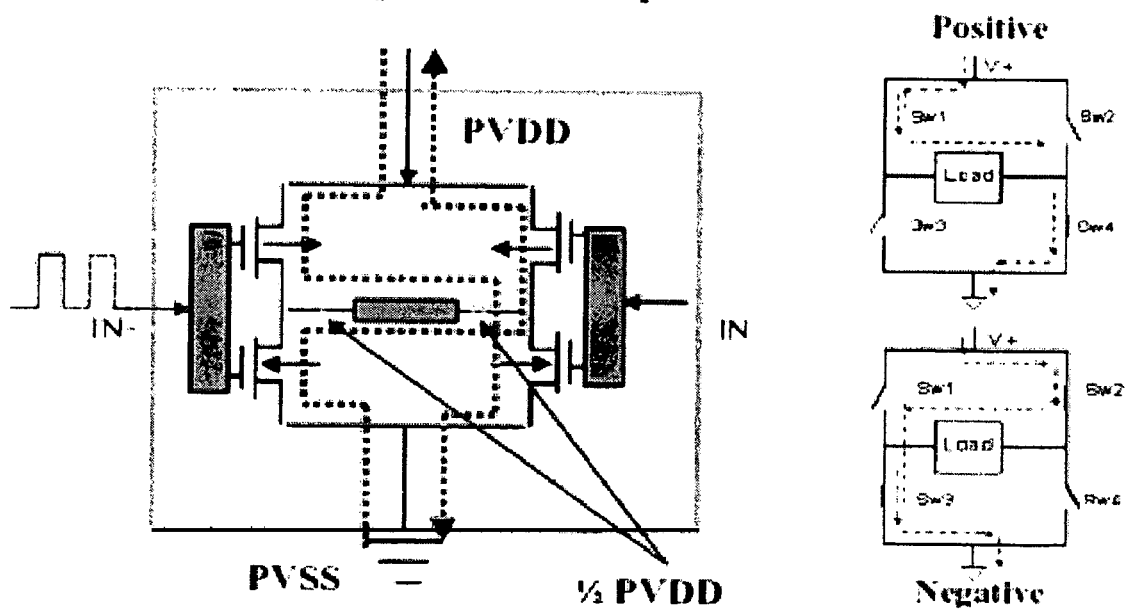
FIG. 5 is a diagram showing an embodiment of the digital power amplifier to which the present invention is applied.

For example, as shown in FIGS. 4 and 5, the microprocessor 60 performs data communication with the digital power amplifier 20 according to I2S format and adjusts the turn on/off time of Metal-Oxide-Silicon Field Effect Transistors (MOSFETs) provided in the digital power amplifier 20, so that it can adjust the value of the PWM modulation index. In this case, I2S format data is programmed in accordance with the specification of an Integrated Circuit (IC) that generates PWM signals.

Figure 6:
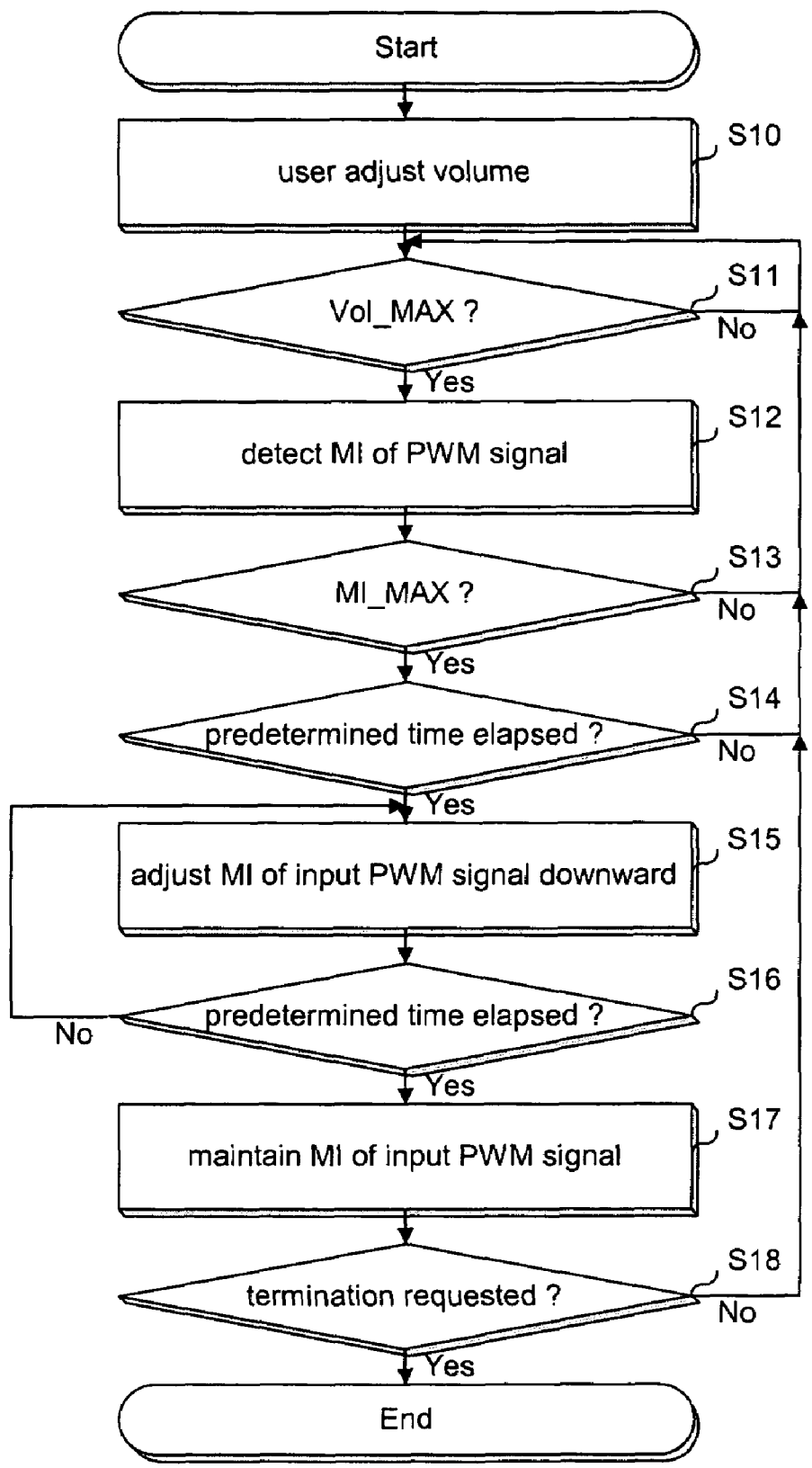
FIG. 6 is a flowchart illustrating a method of controlling the temperature of an electronic apparatus according to the present invention.

FIG. 6 is a flowchart illustrating a method of controlling the temperature of an electronic apparatus according to the present invention.

The microprocessor 60 adjusts an amplification level in the digital power amplifier 20 according to a user's manipulation of a volume up/down key at step S10, and determines whether the user has set a volume at a value Vol_MAX allowable in the digital power amplifier 20 at step S11.

When the user has adjusted the volume to be the maximum value Vol_MAX, the microprocessor 60 generates corresponding control data and then outputs the generated control data to the digital power amplifier 20. The digital power amplifier 20 amplifies the level of the PWM signal, which is output from the modulator 10, to the maximum and then outputs the amplified signal, in response to the control data.

When the user has adjusted the volume to be the predetermined maximum value Vol_MAX, the duty ratio detector 50 detects the duty ratio (or modulation index) of the PWM signal and transfers the detected duty ratio to the microprocessor 60 at step S12.

The microprocessor 60 determines whether the duty ratio detected by the duty ratio detector 50 has reached the predetermined maximal value MI_MAX at step S13. At step S14, if it is determined that the duty ratio has reached the maximum value MI_MAX, the microprocessor 60 measures the time during which the maximum value is continuously detected and determines whether a predetermined time has elapsed.

When the predetermined time has elapsed after the detected duty ratio has reached the maximum value, the microprocessor 60 determines that heat generated by the digital power amplifier 20 is very high, generates control data for reducing the duty ratio of the PWM signal, and then outputs the generated control data to the digital power amplifier 20. The digital power amplifier 20 adjusts the duty ratio of the PWM signal, which is output from the modulator 10, to a value lower than the predetermined maximum value MI_MAX in response to the control data at step S15.

Thereafter, the microprocessor 60 determines whether a predetermined time has elapsed at step S16. If it is determined that the predetermined time has elapsed, the microprocessor 60 determines that heat generated by the digital power amplifier 20 is not high, generates control data for keeping the original duty ratio of the PWM signal received from the modulator 10 unchanged and then outputs the control data to the digital power amplifier 20. In this case, the digital power amplifier 20 amplifies the PWM signal received from the modulator 10 without adjustment of the duty ratio of the PWM signal in response to the control data input at step S17.

The above-described steps S11 to S17 are repeated until the termination of playback is requested at step S18, so that the temperature of the power amplifier can be prevented from rapidly increasing.

For reference, the microprocessor 60 determines that heat generated by the digital power amplifier 20 is high at step S15 and then operates the cooling fan so as to reduce heat generated by the digital power amplifier and different electronic components, therefore the temperature of the electronic apparatus can be efficiently prevented from increasing.

According to the present invention, the temperature of the power amplifier can be prevented from rapidly increasing, the internal temperature of an electronic apparatus can be efficiently prevented from increasing, and damage to the power amplifier resulting from increased temperature can be prevented.

Although a preferred embodiment of the present invention described above has been disclosed for illustrative purposes, various modifications, variations, substitutions or additions thereto are possible, without departing from the scope and spirit of the invention disclosed in the accompanying claims.

What is claimed is:

1. A method of controlling temperature of an electronic apparatus, comprising the steps of:

determining whether a state, in which a duty ratio of a Pulse Width Modulation (PWM) signal is kept equal to or greater than a predetermined value, has been maintained for a first time period; and adjusting the duty ratio of the PWM signal of a digital power amplifier downward if the state has been maintained for the predetermined time.

2. The method set forth in claim 1, further comprising the step of maintaining the duty ratio of the PWM signal without change when the duty ratio of the PWM signal is adjusted downward for a second time period.

3. The method set forth in claim 1, wherein the duty ratio of the PWM signal is adjusted downward only when volume is set to a maximum value allowable in the digital power amplifier.

4. An apparatus for controlling temperature of an electronic apparatus, comprising:
- a modulation unit for modulating input data to generate a PWM signal;
- an amplification unit for amplifying the PWM signal received from the modulation unit;
- a detection unit for detecting a duty ratio of the PWM signal; and
- a control unit for determining whether a state, in which the duty ratio of the PWM signal is kept equal to or greater than a predetermined value, has been maintained for a first time period, and controlling the amplification unit so that the duty ratio of the PWM signal to be output from the amplification unit is adjusted downward if the state has been maintained for the predetermined time period.

5. The apparatus as set forth in claim 4, wherein the control unit controls the amplification unit so that the duty ratio of the PWM signal is kept unchanged when the duty ratio of the PWM signal is adjusted downward for a second time period.

6. The apparatus as set forth in claim 4, wherein the control unit adjusts the duty ratio of the PWM signal downward only when volume is set to a maximum value allowable in the amplification unit.

7. The apparatus as set forth in claim 4, wherein the apparatus is a home theater system.

* * * * *